(12) United States Patent
Abe

(10) Patent No.: US 6,410,979 B2
(45) Date of Patent: *Jun. 25, 2002

(54) BALL-GRID-ARRAY SEMICONDUCTOR DEVICE WITH PROTRUDING TERMINALS

(75) Inventor: Masaaki Abe, Kumamoto (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/465,755

(22) Filed: Dec. 17, 1999

(30) Foreign Application Priority Data

Dec. 21, 1998 (JP) .............................. 10-363557

(51) Int. Cl.$^7$ .................. H01L 23/48; H01L 29/46; H01L 23/28; H01L 23/36
(52) U.S. Cl. .................. 257/684; 257/796; 257/737; 257/738; 257/692; 257/693; 257/696; 257/698; 257/678; 257/784; 257/778; 257/666
(58) Field of Search ................ 257/666, 684, 257/676, 675, 696, 693, 692, 690, 698, 796, 737, 738, 778

(56) References Cited

U.S. PATENT DOCUMENTS

| | | | | |
|---|---|---|---|---|
| 5,258,649 A | * | 11/1993 | Tanaka et al. ............... | 257/796 |
| 5,355,283 A | * | 10/1994 | Marrs et al. ................. | 257/787 |
| 5,612,576 A | * | 3/1997 | Wilson et al. ............... | 257/788 |
| 5,693,573 A | * | 12/1997 | Choi ........................... | 257/796 |
| 5,783,861 A | * | 7/1998 | Son ............................. | 257/666 |
| 5,847,455 A | * | 12/1998 | Manteghi ..................... | 257/737 |
| 5,900,676 A | * | 5/1999 | Kweon et al. ............... | 257/666 |
| 5,976,912 A | * | 11/1999 | Fukutomi et al. ........... | 438/110 |
| 5,999,413 A | * | 12/1999 | Ohuchi et al. ............... | 257/684 |
| 6,072,239 A | * | 6/2000 | Yoneda et al. ............... | 257/738 |
| 6,204,554 B1 | * | 3/2001 | Ewer et al. .................. | 257/705 |
| 6,208,020 B1 | * | 3/2001 | Minamio et al. ........... | 257/684 |
| 6,255,740 B1 | * | 7/2001 | Tsuji et al. .................. | 257/684 |
| 6,278,177 B1 | * | 8/2001 | Ryu ............................. | 257/678 |

FOREIGN PATENT DOCUMENTS

| | | |
|---|---|---|
| JP | 5-47958 | 2/1993 |
| JP | 5-129473 | 5/1993 |
| JP | 10-41432 | 2/1998 |
| JP | 10-247715 | 9/1998 |
| KR | 96-43137 | 12/1996 |

* cited by examiner

*Primary Examiner*—Alexander O. Williams
(74) *Attorney, Agent, or Firm*—McGinn & Gibb, PLLC

(57) ABSTRACT

There is provided a ball-grid-array semiconductor device. The semiconductor device has a semiconductor element sealed with a resin material. In addition, a lead frame is connected to the semiconductor element in the resin material. The lead frame is provided with terminal portions that protrude through the surface of the resin material.

16 Claims, 2 Drawing Sheets

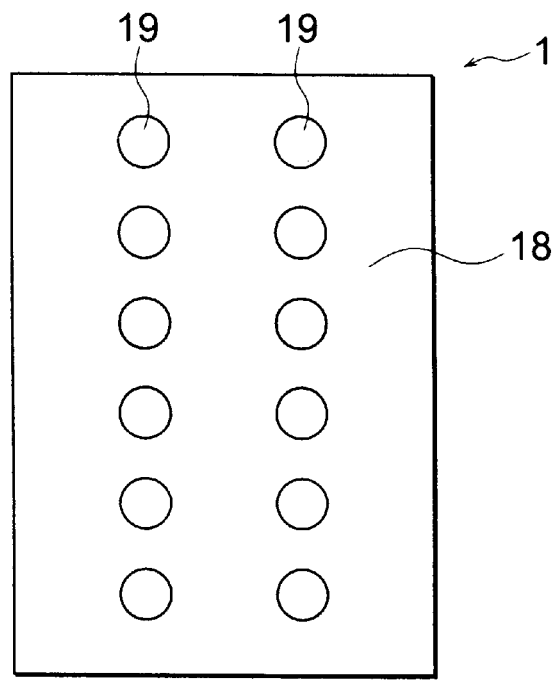
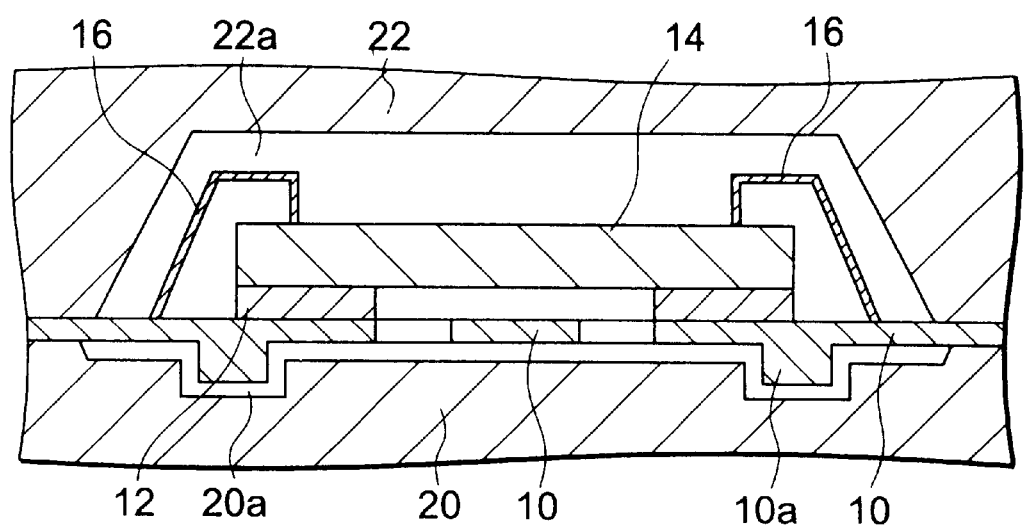

BALL-GRID-ARRAY SEMICONDUCTOR DEVICE WITH PROTRUDING TERMINALS

BACKGROUND OF THE INVENTION

1. Field of the Invention

The present invention relates to a ball-grid-array semiconductor device and a manufacturing method therefor, and more particularly, to a ball-grid-array semiconductor device having a lead frame with terminal portions formed to protrude by etching, and its manufacturing method.

2. Description of the Related Art

A package including a lead frame is available as one of semiconductor device packages that have been manufactured to meet the requirements for semiconductor devices such as higher-integration, miniaturization, decreasing in thickness, and higher pin count. A technique relating to a method for manufacturing lead frames that is applicable to ball-grid-array semiconductor devices is described in Japanese Patent Application Laid-Open No. Sho 60 (1985)-52050. FIG. 1 is a cross-sectional view showing a conventional semiconductor device having a lead frame described in Japanese Patent Application Laid-Open No. Sho 60 (1985)-52050.

According to the prior art described in this publication, in a process where a sheet of metal is etched to form a lead frame, approximately a half of one side of the metal sheet is etched. This allows for forming projected portions 110a for use as external terminals on the side, which protrude in the direction of thickness of the metal sheet. Subsequently, an integrated circuit 114 is attached with a bonding portion 112 to the other side where the projected portions 110a of the lead frame 110 have not been formed. Then, these are sealed with resin 118. At this time, edges of the projected portions 110a and part of the sides of the resin 118 are coplanar. For the conventional semiconductor devices, such method was employed to manufacture the lead frame 110 having terminals for external connection in one process.

However, this presents a problem that it is difficult to clean flux residues remaining between a package and a substrate after the package has been mounted onto the substrate. This happens because the edges of the projected portions 110a, or external terminals, and part of sides of the resin 118 are coplanar.

A method of mounting solder balls onto the projected portions 110a is available to solve this problem, however, this method also presents a problem that material and manufacturing costs are hardly reduced.

SUMMARY OF THE INVENTION

An object of the present invention is to provide a ball-grid-array semiconductor device and manufacturing method therefor, which facilitates cleaning flux residues remaining in between the package and the substrate after having been mounted onto the substrate, and which provides drastically reduced material and manufacturing costs.

According to one aspect of the present invention, a ball-grid-array semiconductor device comprises: a semiconductor element; a resin material which seals the semiconductor element; and a lead frame connected to the semiconductor element in the resin material. The lead frame has a terminal portion that protrudes through a surface of the resin material.

According to another aspect of the present invention, a method for manufacturing a ball-grid-array semiconductor device comprises the steps of: forming a lead frame having a terminal portion that protrudes in the direction of thickness thereof; mounting a semiconductor element on the lead frame; connecting an electrode provided on the semiconductor device to the lead frame by means of a bonding wire; and sealing the semiconductor element with a resin material. The terminal portion protrudes through a surface of the resin material.

The present invention allows the terminal portions to protrude through the surface of the resin material. Thus, the terminal portions can used as connecting terminals, as they are, to be mounted directly to the substrate, and cleaning of flux residues after mounting can be readily carried out. Therefore, conventional ball-grid-array semiconductor devices have required solder balls to be mounted on packages to facilitate cleaning flux residues, whereas the present invention requires no such necessity, allowing for providing remarkably reduced material and manufacturing costs.

BRIEF DESCRIPTION OF THE DRAWINGS

FIG. 3 is a bottom view showing the structure of the ball-grid-array semiconductor device according to the embodiment of the present invention.

FIG. 4 is a view showing the method for manufacturing the ball-grid-array semiconductor device according to the embodiment of the present invention, illustrating the step where the device is sealed with resin.

DETAILED DESCRIPTION OF THE PREFERRED EMBODIMENTS

Figure 1:
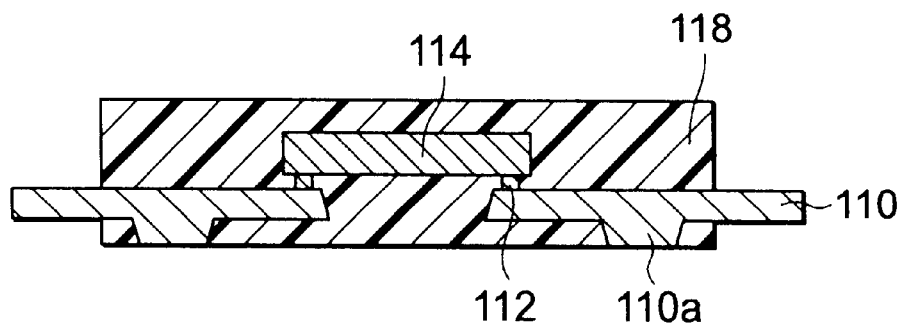
FIG. 1 is a cross-sectional view showing a conventional semiconductor device having a lead frame described in Japanese Patent Application Laid-Open No. Sho 60 (1985)-52050.
Figure 2:
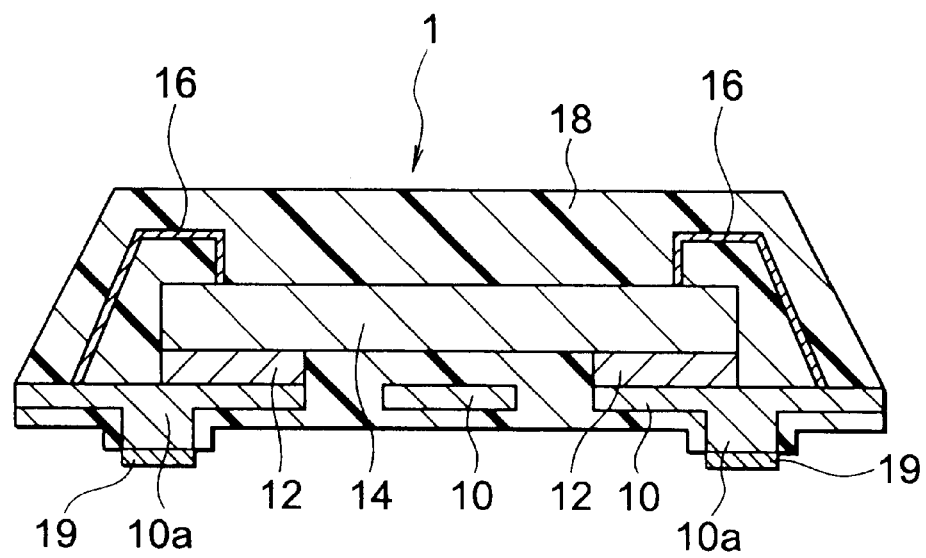
FIG. 2 is a cross-sectional view showing the structure of a ball-grid-array semiconductor device according to an embodiment of the present invention.

The embodiment of the present invention is to be explained specifically with reference to the accompanying drawings. FIG. 2 is a cross-sectional view showing the structure of a ball-grid-array semiconductor device according to the embodiment of the present invention. FIG. 3 is a bottom view showing the structure of the ball-grid-array semiconductor device similarly according to the embodiment of the present invention.

A ball-grid-array semiconductor device 1 according to this embodiment allows a semiconductor element 14 to be mounted with an adhesive tape 12 on a lead frame 10 provided with terminal portions 10a which protrude in the direction of thickness thereof. The lead frame 10 is formed, for example, by etching a sheet of metal approximately a half of the thickness thereof.

Moreover, bonding wires 16 connect the lead frame 10 to electrodes provided on the semiconductor element 14. Then, they are sealed with a resin material 18 to be formed in a predetermined package shape. Incidentally, the terminal portions 10a protrude through the substrate mount surface of the resin material 18. Moreover, a solder layer 19 is formed on the edges of the terminal portions 10a.

The ball-grid-array semiconductor device 1 of this embodiment constructed as such allows the terminal portions 10a, on which the solder layer 19 is formed, to be used as terminals as they are for being mounted on a substrate.

Incidentally, the terminal portions 10a can be etched into a variety of shapes such as a cylinder or a rectangular column. However, a cylindrical shape is desirable in which stress is unlikely to occur, when considering the heat-cycle resisting performance thereof after having been mounted on the substrate.

In addition, the terminal portions 10a have desirably a height ranging from 0.1 to 0.3 mm from the substrate mount surface, when considering the easiness of cleaning flux residues after having been mounted.

Furthermore, the solder layer 19 to be formed on the edges of terminal portions 10a is desirably about 5 to 10 μm in thickness, which is equivalent in thickness to a solder layer to be applied to outer leads of resin-sealed semiconductor devices, typified by conventional QFP (Quad Flat Pack) semiconductor devices.

Next, a method for manufacturing the aforementioned semiconductor device of this embodiment is to be explained. FIG. 4 is a cross-sectional view showing the method for manufacturing the ball-grid-array semiconductor device according to the embodiment of the present invention, illustrating the step where the device is sealed with resin.

First, a sheet of metal is etched approximately by half the thickness thereof to form a lead frame 10 having the terminal portions 10a that protrude in the direction of thickness. Subsequently, a semiconductor element 14 is mounted onto the lead frame 10 with an adhesive tape. Then, the electrodes provided on the semiconductor element 14 are connected to the lead frame 10 by means of bonding wires 16.

Subsequently, as shown in FIG. 4, the lead frame 10, the semiconductor element 14 and the like are sandwiched in between an upper metal mold 22 having a cavity 22a of a predetermined shape and a lower metal mold 20 having recessed portions 20a as a cavity for accommodating the terminal portions 10a. Then, resin is allowed to flow in from an injection portion (not shown) which is in connection with the cavities 20a and 22a, thereby sealing the lead frame 10 and the semiconductor element 14 with the resin.

After the encapsulation with the resin has been completed, there will exist thin fins on the edges of the terminal portions 10a. Thus, those thin fins are removed by laser honing, sand blasting, water jet honing or the like in order to allow the terminal portions 10a of the lead frame 10 to be exposed. Thereafter, a solder layer 19 is formed on the edges of the terminal portions 10a.

Such method as mentioned above allows the terminal portions 10a of the lead frame 10 to protrude through the substrate mount surface of the resin material 18.

As described above, this embodiment allows the terminal portions 10a to protrude through the substrate mount surface of the package and the solder layer 19 to be formed on the edges thereof. Therefore, the terminal portions 10a can be used as connecting terminals, as they are, for being mounted directly to the substrate, and the cleaning of flux residues after the portions have been mounted can be readily carried out. Therefore, conventional ball-grid-array semiconductor devices have required solder balls to be mounted on packages to facilitate cleaning flux residues, whereas this embodiment requires no such necessity, allowing for providing remarkably reduced material and manufacturing costs.

What is claimed is:

1. A ball-grid-array semiconductor device comprising:
a semiconductor element;
a resin material which seals said semiconductor element and has a bottom surface and leg portions extending below said bottom surface, said leg portions being arranged in parallel rows and said bottom surface existing at least between said parallel rows of said leg portions; and
a lead frame formed of a single material and connected to said semiconductor element in said resin material, said lead frame having a bottom surface and a terminal portion for connecting to a substrate, said terminal portion extending below said bottom surface of said lead frame and protruding through a bottom surface of one of said leg portions,
wherein said leg portions elevate said semiconductor device above said substrate so that said bottom surface of said resin material is separated from a surface of said substrate by a space having a height which is at least a length of said leg portions.

2. The ball-grid-array semiconductor device according to claim 1, further comprising a solder layer formed on a surface of said terminal portion.

3. The ball-grid-array semiconductor device according to claim 1, further comprising a bonding wire which connects said semiconductor element to said lead frame.

4. The ball-grid-array semiconductor device according to claim 1, wherein said lead frame comprises a metal sheet which is etched to form said terminal portion which is about one-half of said metal sheet's original thickness.

5. The ball-grid-array semiconductor device according to claim 1, wherein said terminal portion protrudes through said bottom surface of one said leg portions in a direction orthogonal to a surface of said substrate.

6. The ball-grid-array semiconductor device according to claim 1, wherein said terminal portion has a length of about 0.1 to 0.3 mm.

7. The ball-grid-array semiconductor device according to claim 1, wherein said terminal portion has a cylindrical shape.

8. The ball-grid-array semiconductor device according to claim 2, wherein said solder layer has a thickness of about 5 to 10 μm.

9. The ball-grid-array semiconductor device according to claim 2, wherein said solder layer bonds said terminal portion to said substrate.

10. A ball-grid-array semiconductor device comprising:
a semiconductor element;
a resinous coating on said semiconductor element, having a bottom surface and leg portions extending below said bottom surface, said leg portions being arranged in parallel rows and said bottom surface existing at least between said parallel rows of said leg portions; and
a lead frame connected to said semiconductor element in said resinous coating, said lead frame having a bottom surface and a terminal portion for connecting to a subtstrate, said terminal portion extending below said bottom surface of said lead frame and protruding through a bottom surface of one of said leg portions,
wherein said leg portions elevate said semiconductor device so that said bottom surface of said resinous coating is separated from said substrate by a space having a height which is at least a length of said leg portions.

11. The ball-grid-array semiconductor device according to claim 10, wherein said lead frame connects said ball-grid-array semiconductor device to a substrate.

12. The ball-grid-array semiconductor device according to claim 10, further comprising:
a solder layer formed on a surface of said terminal portion.

13. The ball-grid-array semiconductor device according to claim 10, further comprising:
   a bonding wire connecting said semiconductor element to said lead frame.

14. The ball-grid-array semiconductor device according to claim 12, wherein said terminal portion protrudes through said bottom surface of one of said leg portions in a direction orthogonal to a surface of said substrate.

15. The ball-grid-array semiconductor device according to claim 10, wherein said terminal portion has a length of about 0.1 to 0.3 mm.

16. The ball-grid array semiconductor device according to claim 12, wherein said solder layer has thickness of about 5 to 10 $\mu$m.